(12) United States Patent
Dunkel et al.

(10) Patent No.: US 10,187,989 B2
(45) Date of Patent: Jan. 22, 2019

(54) ELECTRONIC COMPONENT

(71) Applicant: TBS Avionics Co. Ltd., Kwun Tong, Hong Kong (CN)

(72) Inventors: Christoph Dunkel, Auw (CH); Remo Masina, Luzern (CH); Raphael Pirker, St. Anton am Arlberg (AT)

(73) Assignee: TBS Avionics Co. Ltd., Kwun Tong, Hong Kong (CN)

( * ) Notice: Subject to any disclaimer, the term of this patent is extended or adjusted under 35 U.S.C. 154(b) by 0 days.

(21) Appl. No.: 15/276,547

(22) Filed: Sep. 26, 2016

(65) Prior Publication Data

US 2017/0094792 A1 Mar. 30, 2017

(30) Foreign Application Priority Data

Sep. 28, 2015 (DE) .................... 20 2015 105 092 U

(51) Int. Cl.
*H05K 1/14* (2006.01)
*A63H 27/00* (2006.01)
*A63H 29/22* (2006.01)
*H05K 1/18* (2006.01)

(52) U.S. Cl.
CPC ............. *H05K 1/144* (2013.01); *A63H 27/02* (2013.01); *A63H 27/12* (2013.01); *A63H 29/22* (2013.01); *H05K 1/181* (2013.01); *H05K 2201/042* (2013.01); *H05K 2201/09027* (2013.01); *H05K 2201/09063* (2013.01); *H05K 2201/10295* (2013.01); *H05K 2201/10409* (2013.01); *H05K 2201/2036* (2013.01)

(58) Field of Classification Search
CPC .................... H05K 1/141–1/144; H05K 7/142
USPC ......... 361/770, 790, 803; 174/138 D, 138 F; 439/65–66, 74
See application file for complete search history.

(56) References Cited

U.S. PATENT DOCUMENTS

| | | | | | |
|---|---|---|---|---|---|
| 4,875,140 | A | * | 10/1989 | Delpech ................. | H05K 7/142 174/138 D |
| 5,013,249 | A | * | 5/1991 | Lindeman .......... | H01R 13/2407 439/66 |
| 5,956,835 | A | * | 9/1999 | Aksu .................. | G01R 1/07328 174/166 S |
| 6,280,202 | B1 | * | 8/2001 | Alden, 3rd ............. | H05K 7/142 174/138 D |
| 6,431,879 | B2 | * | 8/2002 | Brekosky ............... | H05K 7/142 361/804 |
| 6,917,526 | B2 | | 7/2005 | Ajioka et al. | |
| 2001/0031568 | A1 | * | 10/2001 | Brekosky ............... | H05K 7/142 439/74 |
| 2008/0101049 | A1 | * | 5/2008 | Casto ........................ | G06F 1/18 361/788 |

(Continued)

*Primary Examiner* — Tuan T Dinh
(74) *Attorney, Agent, or Firm* — Oppedahl Patent Law Firm LLC

(57) ABSTRACT

The invention concerns an electronic component that comprises a printed circuit board stack with multiple printed circuit boards arranged one on top of the other and that is used, in particular, for model aircraft or commercially utilized unmanned aircraft. The printed circuit boards are held at a distance from one another by spacers. The fastening elements that are provided here are electrically conductive in design, and the printed circuit boards are connected to one another in an electrically conductive manner and also mechanically by these fastening elements.

18 Claims, 4 Drawing Sheets

(56) References Cited

U.S. PATENT DOCUMENTS

2013/0148322 A1* 6/2013 Fosnes ................... H05K 1/141
                                                            361/803
2015/0146400 A1* 5/2015 Huffman ................ H05K 1/144
                                                            361/790

* cited by examiner

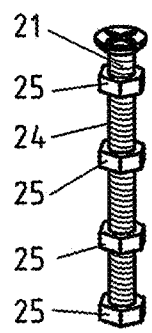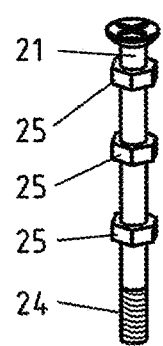
FIG.3a   FIG.3b   FIG.3c

ELECTRONIC COMPONENT

BACKGROUND OF THE INVENTION

The invention concerns an electronic component that comprises a printed circuit board stack with multiple printed circuit boards arranged one on top of the other and that is used, in particular, for model aircraft or commercially utilized unmanned aircraft.

Aeromodelling is currently experiencing enormous surges in development, on the one hand, because of an increase in the performance of propeller motors, and, on the other hand, because of the availability of increased electrical storage capacity. This makes a quadcopter style possible for drones. These multi-motor quadcopters are equipped with three to eight motors, for example. The electric power for these motors is provided by lithium polymer rechargeable batteries. This drive type makes possible high performance of the quadcopter with small size.

Especially in the field of quadcopters, electronic speed controllers with high power consumption in a range up to a few hundred amperes are used. One controller is used for each motor, and adapts the power supply and thus the speed to the various needs, for example, ascent, horizontal alignment, initiation of course changes, and the like. At the same time, these electronic control units must be designed to be compact, weight-saving, robust, and easy to assemble.

It is known to construct electronic components from multiple printed circuit boards. However, if multiple layers of printed circuit boards are used, firstly, they must be mechanically connected to one another in the component or module and, secondly, plug and cable connections are used for the power supply. Suitable soldered connections between the connectors and the printed circuit boards are required for this purpose. Such connections disadvantageously represent a risk element with regard to operational reliability of the model aircraft, because these connections are subjected to a tremendous stress caused by vibrations of the aircraft, shock, and large temperature differences. Thus, hairline cracks that endanger operational dependability can occur at the soldered points, especially in the event of unforeseen impacts or severe shocks.

BRIEF SUMMARY OF THE INVENTION

The object of the present invention is to provide a compact, weight-saving yet also robust, and easy-to-assemble electronic component that satisfies, in particular, stringent demands with regard to vibrations, shock and temperature differences such as occur with model aircraft or commercially utilized unmanned aircraft.

This object is attained by an electronic component with the features of claim 1. Advantageous embodiments are described by the dependent claims.

The novel electronic component comprises a printed circuit board stack with at least two printed circuit boards arranged one on top of the other, preferably with more than two printed circuit boards, and printed circuit board stacks with four or six printed circuit boards arranged one on top of the other are especially preferred. In a known fashion, the printed circuit boards carry electronic components that are supplied with the appropriate electric power through electrically conductive connections in the form of conductive traces. Electrical connections are also provided between the different printed circuit boards. However, these are not plug and cable connections that are soldered to the individual printed circuit boards. In the novel electronic component, electrically conductive fastening elements are used that mechanically connect the printed circuit boards to one another, on the one hand, and, on the other hand, also permit an electrical connection between the printed circuit boards and the power supply.

The printed circuit boards in the printed circuit board stack preferably are arranged parallel to one another and are held at a desired distance from one another by spacers. The shape of the printed circuit boards can be selected freely. The printed circuit board shape may be round, oval or polygonal. Rectangular or square printed circuit boards are preferred, wherein printed circuit boards of the same size or also of different sizes can be arranged in a printed circuit board stack. A printed circuit board stack with printed circuit boards of the same size and shape is preferred.

The fastening elements that ensure the electrically conductive connection and the mechanical connection are preferably provided at the edge on the printed circuit boards, and, in the case of printed circuit boards with a polygonal shape, preferably are provided at the corners of the printed circuit boards. For this purpose, the printed circuit boards have openings at these intended connection points in the manner of drilled holes for the fastening elements, through which the fastening elements reach. The conductive traces provided on the printed circuit boards extend to the joints with the fastening elements, which is to say to these openings. For especially good contact of the electrically conductive fastening element with the conductive traces of the printed circuit boards, the fastening element preferably has a region that overlaps the opening in the printed circuit board, at least in some areas. In the simplest manner, such a fastening element can be a bolt-and-nut connection, wherein the shank of the bolt passes through the opening in the printed circuit board, the bolt head rests against one side of the printed circuit board, and the nut rests against the opposite side of the printed circuit board in the region of the opening in the printed circuit board. In this design, contact can take place in the simplest manner both through the nut and through the bolt head, and takes place with sufficient contact pressure owing to the mechanical threaded connection.

Moreover, in a different embodiment, the shank of the electrically conductive fastening means can also contact a conductive trace extending into the opening.

In order to connect multiple printed circuit boards into a printed circuit board stack, each printed circuit board has appropriate openings for the fastening elements, which results in a stacked arrangement when identical printed circuit board sizes and shapes are provided, in which the openings in the individual printed circuit boards arranged one on top of the other are aligned and form a through passage for the fastening elements. For a sturdy mechanical connection of these printed circuit boards in the printed circuit board stack, at least three openings are provided in each printed circuit board, which produce three through passages in the printed circuit board stack when the printed circuit boards are arranged one on top of the other. For the mechanical connection, one fastening element can be provided for each through passage, for example in the form of a bolt or threaded rod, that is inserted into the individual openings of the through passage and coupled to a nut at the end. In this design, the distances between each of the individual printed circuit boards are achieved through spacers. These can be threaded nuts or metallic spacer rings that are pushed onto the shank of the fastening element and are retained in this way. A robust mechanical connection of the printed circuit boards in the printed circuit board stack is ensured by the threaded connection. Because the fastening element provided is designed to be electrically conductive and the conductive traces of the printed circuit boards extend to the openings, which is to say to the fastening elements, the fastening elements simultaneously serve as electrical connectors to supply the electrical and electronic components provided on the printed circuit boards with the necessary electric power.

In another embodiment, multiple fastening elements can be provided for each through channel, wherein each individual fastening element passes through only one opening, and after that is connected mechanically and in an electrically conductive manner to the next fastening element.

In the printed circuit board stack, individual fastening elements, for example the fastening element or elements of one through passage, or all fastening elements may be intended for the electrical supply. If only one fastening element is to serve as the electrical connection, then the other fastening elements serve only for mechanically connecting the printed circuit boards in the printed circuit board stack. If multiple fastening elements, or all fastening elements, are intended for the electrical connection, then preferably only one fastening element establishes an electrical connection with the power supply.

In a special embodiment, a specially designed base plate and/or cover plate is provided for structural reinforcement of the printed circuit board stack. This base plate and/or cover plate can itself carry electronic components and be a printed circuit board, or can only have conductive traces in order to achieve the electrical connection between the fastening element supplied with electric power from outside and the other fasting elements of the printed circuit board stack.

This novel electronic component represents a compact design of a printed circuit board stack, which, owing to the elimination of plug connections and soldered points, ensures high operational reliability, even in the case of vibrations, shocks and temperature differences, and furthermore is robust and compact in design. In addition, weight is advantageously saved due to the elimination of electrical connectors.

BRIEF DESCRIPTION OF THE SEVERAL VIEWS OF THE DRAWINGS

The invention is explained below with exemplary embodiments with the aid of the drawings. Shown are:

FIG. 3a fastening elements for an electronic component;

FIG. 3b another fastening element for an electronic component;

FIG. 3c another fastening element for an electronic component.

DETAILED DESCRIPTION OF THE INVENTION

Figure 1:
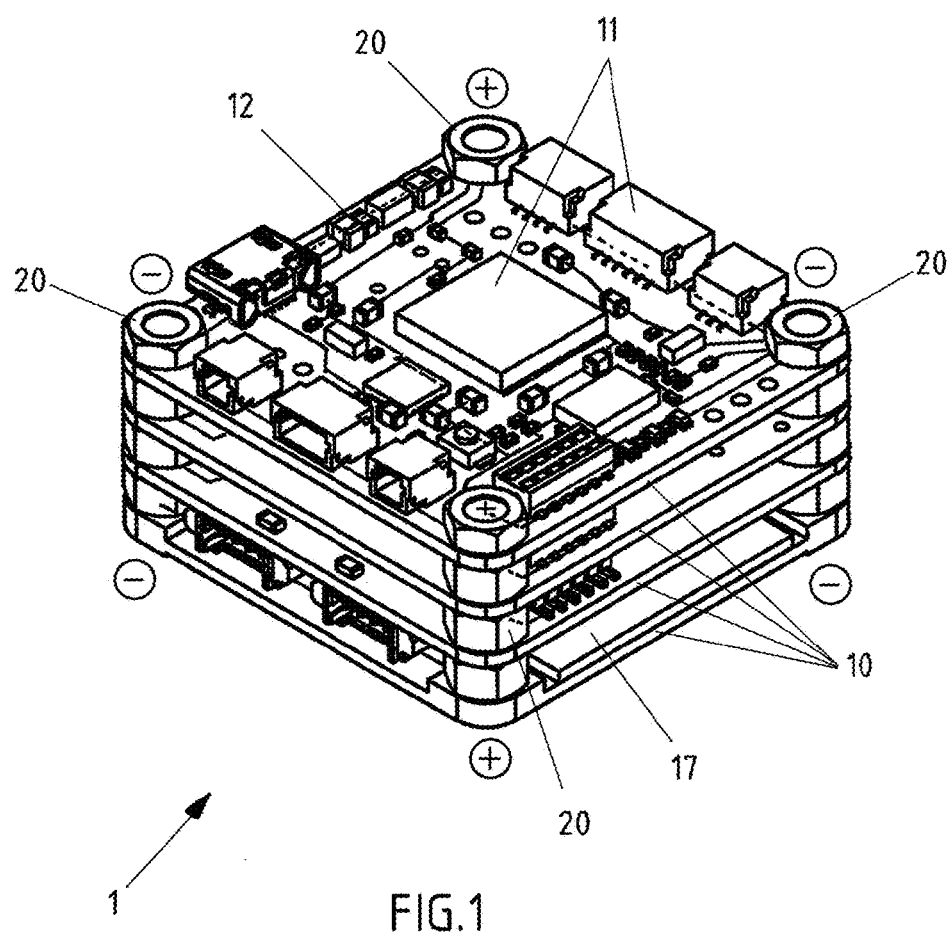
FIG. 1 a perspective view of an electronic component according to the invention.
Figure 1A:
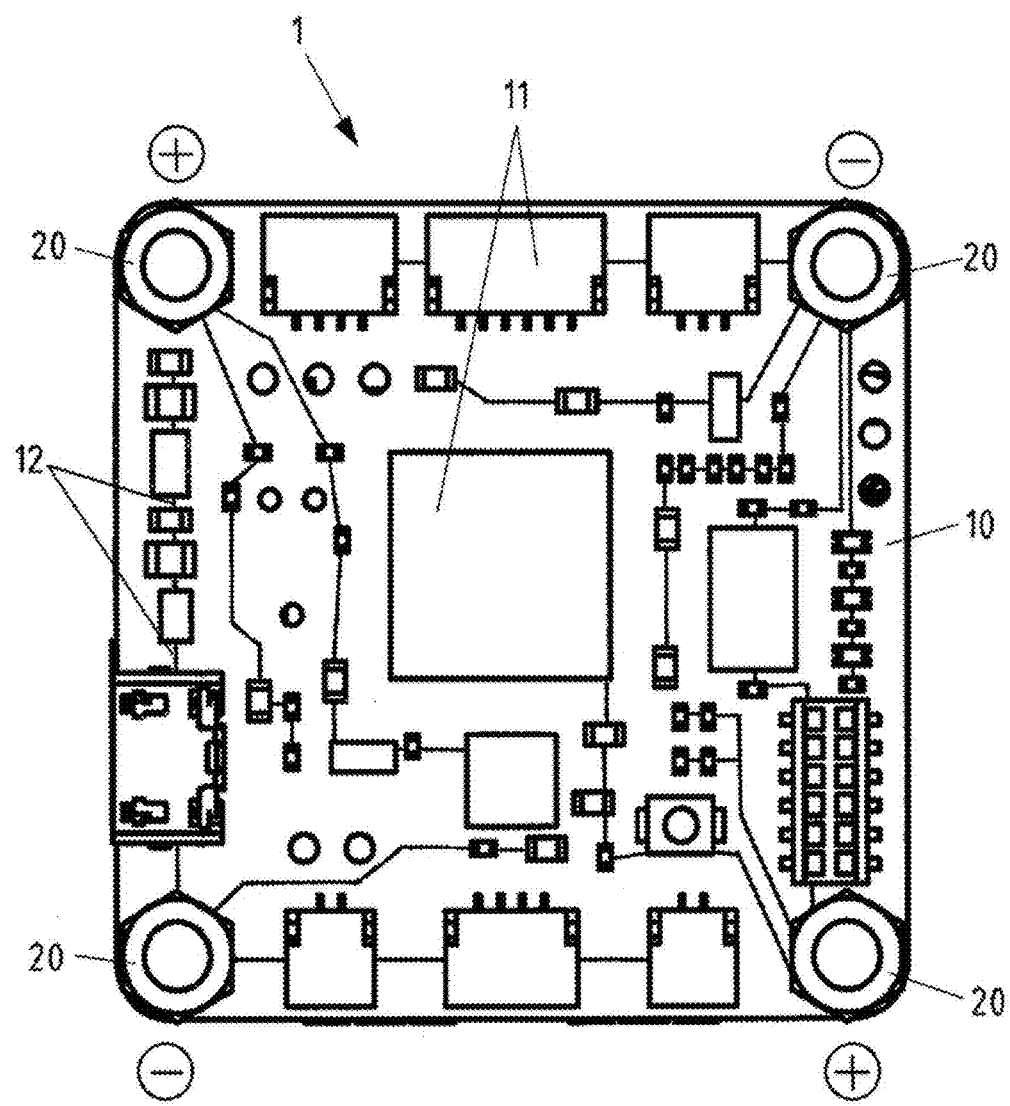
FIG. 1a a top view of the electronic component shown in FIG. 1.

Shown in FIG. 1 is an electronic component, namely a printed circuit board stack 1 with four printed circuit boards 10. Shown in FIG. 1a is a top view of the electronic component shown in FIG. 1. Each printed circuit board is equipped with multiple electronic components 11 that are supplied with electric power through electrically conductive connections. These conductive traces 12 are arranged substantially on the underside in this embodiment shown in FIG. 1. The plus signs (+) and minus signs (−) in FIG. 1, FIG. 1a, and FIG. 2 indicate the power distribution. Each printed circuit board 10 here consists of a square, insulating support that carries the electronic components 11. Provided at each corner of the printed circuit board stack 1 is a fastening element 20 for electrically conductive and mechanical connection, namely, a bolt shown in FIG. 3b, which bolts are inserted from below through openings 13, 14, 15, 16 in the printed circuit boards 10, which are more clearly visible in FIG. 2, and are coupled to nuts 26 at the top to form a sturdy threaded connection. For a multi-layer printed circuit board stack 1 of this nature, spacers 25 are arranged between the individual printed circuit boards 10. These spacers are advantageously connected to the fastening element 20. In this case, they are nuts that are screwed onto the shank 21, which has a thread 24. The fastening element 20, which includes the spacers 25, advantageously ensures a mechanical fastening and a simultaneous carrying of current from one printed circuit board 10 to the next printed circuit board 10. As is evident from FIG. 1, the printed circuit board stack 1 is a compact, extremely robust unit that does not permit any deformation, even in the event of a crash of a model aircraft.

Additional fastening elements 20 that can be used in the exemplary embodiment from FIG. 1 are shown in FIG. 3a and FIG. 3c. The fastening element 20 in FIG. 3c is a bolt that has a thread 24 only in the lower region, namely, for connection with the terminating nut 26. In this case, the ring-shaped spacers 25 are merely pushed onto the shaft 21 of the fastening element 20. However, they are firmly pressed against the individual printed circuit boards by the threaded connection with the nut 26, and exert an adequate contact pressure on the conductive traces 12 that extend to the opening 13, 14, 15, 16, thereby ensuring a good electrical connection.

According to FIG. 3a, fastening is also possible by means of multiple bolt-like fastening elements 20 that can be screwed into one another. Each bolt element 20 has a shank 21 with a thread 24 and a bolt head 22. The thread 24 is not shown in FIG. 2. In the example from FIG. 2, the shank 21 is inserted from below into an opening 13, 14, 15, 16 until the head 22 rests against the underside of the printed circuit board 10. The bolt head 22 can be flat in design in the bottom-most fastening element 20 in order to achieve a space-saving, compact unit. In the rest of the fastening elements 20, the bolt head 22 represents the spacer 25. After it is inserted through the first opening 13, 14, 15, 16, the shank 21 of the bottom-most fastening element 20 is connected to the next bolt-like fastening element 20 located above it. For this purpose, the fastening element 20 preferably has a threaded receptacle in the bolt thread 22. This fastening element 20 is inserted through the next opening 13, 14, 15, 16 in the same manner and connected to the next fastening element 20. In this way, the bottom-most base plate 17 is connected to the printed circuit board 10 located above it, and correspondingly to the other identically designed square printed circuit boards 10, which have openings 13, 14, 15, 16 at the same points, namely, in the corners. Above the cover plate, the top-most fastening elements 20 are each coupled to a nut 26, and, in this way, a sturdy mechanical connection is achieved. In advantageous fashion, the openings 13, 14, 15, 16 are provided at the same point in all printed circuit boards 10 of the same size and shape so that when the printed circuit boards are arranged one on top of the other prior to assembly, these openings align and form a through channel for the fastening elements 20.

Figure 2:
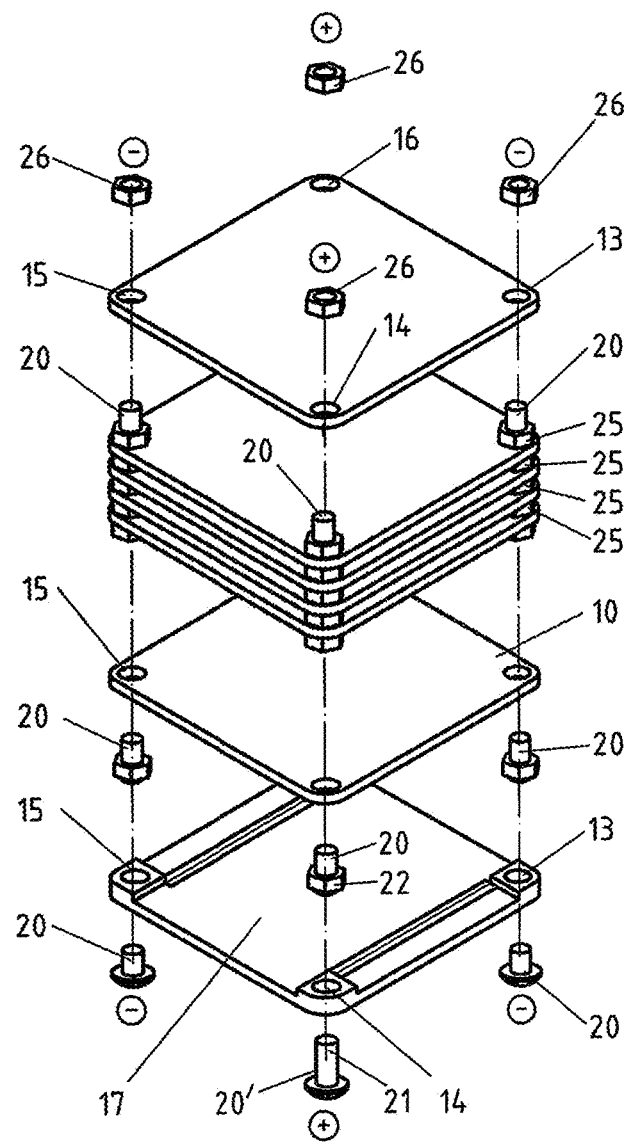
FIG. 2 a simplified perspective representation of another electronic component.

For the electrical supply to this printed circuit board stack 1 in this exemplary embodiment from FIG. 2, solely one fastening element 20' is used, which in this case has a longer shank 21, thereby allowing a connection with the structure of the aircraft. The electrical connection to the power supply is ensured by means of this fastening element 20'. The fastening element 20'—which is electrically conductive in design—reaches through the opening 14 and is mechanically and electrically connected to another fastening element 20. This fastening element 20 has a bolt head 22 that is larger than the diameter of the opening 14 and can in this way make contact by means of its electrically conductive head 22 with the conductive traces 12 on the base plate 17, which leads to the opening 13 as shown. In the same manner, it is also possible to provide, on this base plate 17, conductive traces 12 to the other fastening elements 20 that reach through the openings 13, 15, 16, in order to supply electrical energy through all fastening elements 20. For reasons of better clarity, the electrical and electronic components 11 are omitted on the other printed circuit boards 10 in FIG. 2. Owing to the mechanical connection of the base plate 17 to the printed circuit boards 10 located above it, an electrical connection to the conductive traces 12 located on these printed circuit boards 10 is also achieved, these conductive traces in this case extending up to the openings 13, 14. In the event that the base plate 17 has conductive traces 12 which also contact the fastening elements 20 that reach through the openings 15, 16, then the electrical connection with the other printed circuit boards 10 can also be ensured through these fastening elements 20.

In addition, it is evident from FIG. 2 that the heads 22 of the fastening elements 20 advantageously serve as spacers 25. Serving in each case as a terminating fastener is a nut 26, which is provided above the top-most printed circuit board 10. The bottom-most plate, the base plate 17, is reinforced to make for a sturdy unit and, in this example from FIG. 2, has only the conductive traces 12. The printed circuit board stack 1 is mechanically connected to the aircraft body and electrically connected to the power supply by this reinforced base plate 17 and the fastening element 20'. However, a reinforced printed circuit board 10 can also be provided as the base plate 17, as shown in FIG. 1.

LIST OF REFERENCE NUMERALS 1 component, printed circuit board stack
10 printed circuit board
11 electrical components
12 conductive traces
13 opening
14 opening
15 opening
16 opening
17 base plate
20, 20' fastening element
21 shank
22 bolt head
24 thread
25 spacer
26 nut

The invention claimed is:

1. An electronic component, in particular for a model aircraft or a commercially utilized unmanned aircraft, comprising:

a stack of printed circuit boards,
the circuit boards fastened to each other by at least a first male threaded metal fastening element passing through a first hole in a first one of the circuit boards, the first male threaded metal fastening element passing into a first female threaded metal spacer, the first male threaded metal fastening element being in tight engagement with the first female threaded metal spacer;
the circuit boards further fastened to each other by at least a second male threaded metal fastening element in tight engagement with the first female threaded metal spacer, the second male threaded metal fastening element passing through a first hole in a second one of the circuit boards, the second male threaded metal fastening element passing into a second female threaded metal spacer, the second male threaded metal fastening element being in tight engagement with the second female threaded metal spacer;
the circuit boards further fastened to each other by at least a third male threaded metal fastening element in tight engagement with the second female threaded metal spacer, the third metal fastening element passing through a first hole in a third one of the circuit boards, the third male threaded metal fastening element passing into a first female threaded metal terminating nut, the third male threaded metal fastening element being in tight engagement with the first female threaded metal terminating nut;
the first one of the circuit boards having a first conductive trace;
the second one of the circuit boards having a second conductive trace;
the third one of the circuit boards having a third conductive trace;
the first conductive trace having electrical continuity with the second conductive trace by means of the first male threaded metal fastening element and the first female threaded metal spacer and the second male threaded metal fastening element and the second female threaded metal spacer;
the second conductive trace having electrical continuity with the third conductive trace by means of the second male threaded metal fastening element and the second female threaded metal spacer and the third male threaded metal element and the first female threaded metal terminating nut;
further characterized in that the first male threaded metal fastening element and the first female threaded metal spacer and the second male threaded metal fastening element and the second female threaded metal spacer simultaneously fasten the first and second circuit boards together and provide electrical connectivity between the first and second circuit boards; and
further characterized in that the second male threaded metal fastening element and the second female threaded metal spacer and the third male threaded metal fastening element and the first female threaded metal terminating nut simultaneously fasten the second and third circuit boards together and provide electrical connectivity between the second and third circuit boards.

2. The electronic component of claim 1 further characterized in that the circuit boards are further fastened to each other by at least a fourth male threaded metal fastening element passing through a second hole in the first one of the circuit boards, the fourth male threaded metal fastening element passing into a third female threaded metal spacer, the fourth male threaded metal fastening element being in tight engagement with the third female threaded metal spacer;

the circuit boards further fastened to each other by at least a fifth male threaded metal fastening element in tight engagement with the third female threaded metal spacer, the fifth male threaded metal fastening element passing through a second hole in the second one of the circuit boards, the fifth male threaded metal fastening element passing into a fourth female threaded metal spacer, the fifth male threaded metal element being in tight engagement with the fourth female threaded metal spacer;

the circuit boards further fastened to each other by at least a sixth male threaded metal fastening element in tight engagement with the fourth female threaded metal spacer, the sixth male threaded metal fastening element passing through a second hole in the third one of the circuit boards, the sixth male threaded metal fastening element passing into a second female threaded metal terminating nut, the sixth male threaded metal fastening element being in tight engagement with the second female threaded metal terminating nut;

the first one of the circuit boards having a fourth conductive trace;

the second one of the circuit boards having a fifth conductive trace;

the third one of the circuit boards having a sixth conductive trace;

the fourth conductive trace having electrical continuity with the fifth conductive trace by means of the fourth male threaded metal fastening element and the third female threaded metal spacer and the fifth male threaded metal fastening element and the fourth female threaded metal spacer;

the fifth conductive trace having electrical continuity with the sixth conductive trace by means of the fifth male threaded metal fastening element and the fourth female threaded metal spacer and the sixth male threaded metal fastening element and the second female threaded metal terminating nut;

further characterized in that the fourth male threaded metal fastening element and the third female threaded metal spacer and the fifth male threaded metal fastening element and the fourth female threaded metal spacer simultaneously fasten the first and second circuit boards together and provide electrical connectivity between the first and second circuit boards; and further characterized in that the fifth male threaded metal fastening element and the fourth female threaded metal spacer and the sixth male threaded metal fastening element and the second female threaded metal spacer simultaneously fasten the second and third circuit boards together and provide electrical connectivity between the second and third circuit boards.

3. The electronic component according to claim 1, wherein the stack of printed circuit boards has a bottommost circuit board, and wherein the bottommost circuit board is reinforced in design and connected mechanically and electrically to the aircraft.

4. The electronic component according to claim 1, wherein the stack of printed circuit boards has a topmost circuit board, and wherein the topmost circuit board is reinforced in design and connected mechanically and electrically to the aircraft.

5. The electronic component according to claim 1, wherein the stack of printed circuit boards has a bottommost circuit board, wherein the bottommost circuit board has a bottom and a top, and wherein a base plate is connected to the bottom of the bottommost circuit board and the base plate is connected mechanically and electrically to the aircraft.

6. The electronic component according to claim 1, wherein the stack of printed circuit boards has a topmost circuit board, wherein the topmost circuit board has a bottom and a top, and wherein a cover plate is connected to the top of the topmost circuit board and the cover plate is connected mechanically and electrically to the aircraft.

7. An electronic component, in particular for a model aircraft or a commercially utilized unmanned aircraft, comprising:

a stack of printed circuit boards, the circuit boards fastened to each other by at least a first male threaded metal fastening element passing through a first hole in a first one of the circuit boards, the first male threaded metal fastening element passing into a first female threaded metal spacer, the first male threaded metal fastening element being in tight engagement with the first female threaded metal spacer;

the circuit boards further fastened to each other by the first male threaded metal fastening element passing through a first hole in a second one of the circuit boards, the first male threaded metal fastening element passing into a second female threaded metal spacer, the first male threaded metal fastening element being in tight engagement with the second female threaded metal spacer;

the circuit boards further fastened to each other by the first male threaded metal fastening element passing through a first hole in a third one of the circuit boards, the first male threaded metal fastening element passing into a first female threaded metal terminating nut, the first male threaded metal fastening element being in tight engagement with the first female threaded metal terminating nut;

the first one of the circuit boards having a first conductive trace;

the second one of the circuit boards having a second conductive trace;

the third one of the circuit boards having a third conductive trace;

the first conductive trace having electrical continuity with the second conductive trace by means of the first male threaded metal fastening element and the first female threaded metal spacer;

the second conductive trace having electrical continuity with the third conductive trace by means of the first male threaded metal fastening element and the second female threaded metal spacer and the first male threaded metal fastening element and the first female threaded metal terminating nut;

further characterized in that the first male threaded metal fastening element and the first female threaded metal spacer and the first male threaded metal fastening element and the second female threaded metal spacer simultaneously fasten the first and second circuit boards together and provide electrical connectivity between the first and second circuit boards; and further characterized in that the first male threaded metal fastening element and the second female threaded metal spacer and the first male threaded metal fastening element and the first female threaded metal terminating nut simultaneously fasten the second and third circuit boards together and provide electrical connectivity between the second and third circuit boards.

8. The electronic component of claim 7 further characterized in that the circuit boards are further fastened to each other by at least a second male threaded metal fastening element passing through a second hole in the first one of the circuit boards, the second male threaded metal fastening element passing into a third female threaded metal spacer, the second male threaded metal fastening element being in tight engagement with the third female threaded metal spacer;

the circuit boards further fastened to each other by the second male threaded metal fastening element passing through a second hole in a second one of the circuit boards, the second male threaded metal fastening element passing into a fourth female threaded metal spacer, the second male threaded metal fastening element being in tight engagement with the fourth female threaded metal spacer;

the circuit boards further fastened to each other by the second male threaded metal fastening element passing through a second hole in a third one of the circuit boards, the second male threaded metal fastening element passing into a second female threaded metal terminating nut, the second male threaded metal fastening element being in tight engagement with the second female threaded metal terminating nut;

the first one of the circuit boards having a fourth conductive trace;

the second one of the circuit boards having a fifth conductive trace;

the third one of the circuit boards having a sixth conductive trace;

the fourth conductive trace having electrical continuity with the fifth conductive trace by means of the second male threaded metal fastening element and the third female threaded metal spacer;

the fifth conductive trace having electrical continuity with the sixth conductive trace by means of the second male threaded metal fastening element and the fourth female threaded metal spacer and the second male threaded metal fastening element and the second female threaded metal terminating nut;

further characterized in that the second male threaded metal fastening element and the third female threaded metal spacer and the second male threaded metal fastening element and the fourth female threaded metal spacer simultaneously fasten the first and second circuit boards together and provide electrical connectivity between the first and second circuit boards; and further characterized in that the second male threaded metal fastening element and the fourth female threaded metal spacer and the second male threaded metal fastening element and the second female threaded metal terminating nut simultaneously fasten the second and third circuit boards together and provide electrical connectivity between the second and third circuit boards.

9. The electronic component according to claim 7, wherein the stack of printed circuit boards has a bottommost circuit board, and wherein the bottommost circuit board is reinforced in design and connected mechanically and electrically to the aircraft.

10. The electronic component according to claim 7, wherein the stack of printed circuit boards has a topmost circuit board, and wherein the topmost circuit board is reinforced in design and connected mechanically and electrically to the aircraft.

11. The electronic component according to claim 7, wherein the stack of printed circuit boards has a bottommost circuit board, wherein the bottommost circuit board has a bottom and a top, and wherein a base plate is connected to the bottom of the bottommost circuit board and the base plate is connected mechanically and electrically to the aircraft.

12. The electronic component according to claim 7, wherein the stack of printed circuit boards has a topmost circuit board, wherein the topmost circuit board has a bottom and a top, and wherein a cover plate is connected to the top of the topmost circuit board and the cover plate is connected mechanically and electrically to the aircraft.

13. An electronic component, in particular for a model aircraft or a commercially utilized unmanned aircraft, comprising:

a stack of printed circuit boards, the circuit boards connected to each other by at least a first metal fastening element, the first metal fastening element having an upper region and a lower region, wherein the upper region is smooth and terminates in a bolt head and wherein the lower region is male threaded, the first metal fastening element passing through a first hole in a first one of the circuit boards, the first metal fastening element passing through a first metal spacer;

the circuit boards further connected to each other by the first metal fastening element passing through a first hole in a second one of the circuit boards, the first metal fastening element passing into a second metal spacer;

the circuit boards further connected to each other by the first metal fastening element passing through a first hole in a third one of the circuit boards, the first metal fastening element passing into a first female threaded metal terminating nut, the threaded lower region of the first metal fastening element being in tight engagement with the first female threaded metal terminating nut such that the first one of the circuit boards is in contact with the bolt head of the first metal fastening element and the first metal spacer, and the second one of the circuit boards is in contact with the first metal spacer and the second metal spacer, and the third one of the circuit boards is in contact with the second metal spacer and the first female threaded metal terminating nut;

the first one of the circuit boards having a first conductive trace;

the second one of the circuit boards having a second conductive trace;

the third one of the circuit boards having a third conductive trace;

the first conductive trace having electrical continuity with the second conductive trace by means of the first metal fastening element and the first metal spacer and the first metal fastening element and the second metal spacer;

the second conductive trace having electrical continuity with the third conductive trace by means of the first metal fastening element and the second metal spacer and the first metal fastening element and the first female threaded metal terminating nut;

further characterized in that the first metal fastening element and the first metal spacer and the first metal fastening element and the second metal spacer simultaneously connect the first and second circuit boards together and provide electrical connectivity between the first and second circuit boards; and further characterized in that the first metal fastening element and the second metal spacer and the first metal fastening element and the first female threaded metal terminating nut simultaneously connect the second and third circuit boards together and provide electrical connectivity between the second and third circuit boards.

14. The electronic component of claim 13 further characterized in that the circuit boards are further fastened to each other by at least a second metal fastening element, the second metal fastening element having an upper region and a lower region, wherein the upper region is smooth and terminates in a bolt head and wherein the lower region is male threaded, the second metal fastening element passing through a second hole in the first one of the circuit boards, the second metal fastening element passing through a third metal spacer;

the circuit boards further connected to each other by the second metal fastening element passing through a second hole in the second one of the circuit boards, the second metal fastening element passing into a fourth metal spacer;

the circuit boards further connected to each other by the second metal fastening element passing through a second hole in the third one of the circuit boards, the second metal fastening element passing into a second female threaded metal terminating nut, the threaded lower region of the second metal fastening element being in tight engagement with the second female threaded metal terminating nut such that the first one of the circuit boards is in contact with the bolt head of the second metal fastening element and the third metal spacer, and the second one of the circuit boards is in contact with the third metal spacer and the fourth metal spacer, and the third one of the circuit boards is in contact with the fourth metal spacer and the second female threaded metal terminating nut;

the first one of the circuit boards having a fourth conductive trace;

the second one of the circuit boards having a fifth conductive trace;

the third one of the circuit boards having a sixth conductive trace;

the fourth conductive trace having electrical continuity with the fifth conductive trace by means of the second metal fastening element and the third metal spacer and the second metal fastening element and the fourth metal spacer;

the fifth conductive trace having electrical continuity with the sixth conductive trace by means of the second metal fastening element and the fourth metal spacer and the second metal fastening element and the second female threaded metal terminating nut;

further characterized in that the second metal fastening element and the third metal spacer and the second metal fastening element and the fourth metal spacer simultaneously connect the first and second circuit boards together and provide electrical connectivity between the first and second circuit boards; and further characterized in that the second metal fastening element and the fourth metal spacer and the second metal fastening element and the second female threaded metal terminating nut simultaneously connect the second and third circuit boards together and provide electrical connectivity between the second and third circuit boards.

15. The electronic component according to claim 13, wherein the stack of printed circuit boards has a bottommost circuit board, and wherein the bottommost circuit board is reinforced in design and connected mechanically and electrically to the aircraft.

16. The electronic component according to claim 13, wherein the stack of printed circuit boards has a topmost circuit board, and wherein the topmost circuit board is reinforced in design and connected mechanically and electrically to the aircraft.

17. The electronic component according to claim 13, wherein the stack of printed circuit boards has a bottommost circuit board, wherein the bottommost circuit board has a bottom and a top, and wherein a base plate is connected to the bottom of the bottommost circuit board and the base plate is connected mechanically and electrically to the aircraft.

18. The electronic component according to claim 13, wherein the stack of printed circuit boards has a topmost circuit board, wherein the topmost circuit board has a bottom and a top, and wherein a cover plate is connected to the top of the topmost circuit board and the cover plate is connected mechanically and electrically to the aircraft.

\* \* \* \* \*